(12) United States Patent
Saito

(10) Patent No.: US 7,130,181 B2
(45) Date of Patent: Oct. 31, 2006

(54) SEMICONDUCTOR DEVICE

(75) Inventor: Hiroshi Saito, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/893,644

(22) Filed: Jul. 15, 2004

(65) Prior Publication Data

US 2005/0068714 A1 Mar. 31, 2005

(30) Foreign Application Priority Data

Jul. 15, 2003 (JP) .............................. 2003-197069

(51) Int. Cl.
*H01G 4/228* (2006.01)
*H01L 29/41* (2006.01)

(52) U.S. Cl. .............................. 361/306.2; 361/306.1; 361/306.3; 361/321.1; 361/321.5; 257/295; 257/296; 257/532; 257/534; 257/538

(58) Field of Classification Search ..... 361/306.1–306, 361/321.1–321, 328, 306.2, 306.3, 321.2; 257/295–296, 532–534, 535–538

See application file for complete search history.

(56) References Cited

U.S. PATENT DOCUMENTS 5,083,184 A * 1/1992 Eguchi ...................... 257/532

5,747,375 A * 5/1998 Kaneko et al. ............. 438/396
5,892,266 A * 4/1999 Hirota et al. ............... 257/532
6,278,172 B1 * 8/2001 Tominaga ................... 257/535
6,791,135 B1 * 9/2004 Takenaka .................... 257/296
2003/0006481 A1 * 1/2003 Miyada et al. .............. 257/532

FOREIGN PATENT DOCUMENTS

JP 11-312784 11/1999
JP 11312784 * 11/1999

* cited by examiner

*Primary Examiner*—Nguyen T. Ha
(74) *Attorney, Agent, or Firm*—SoCal IP Law Group LLP; Steven C. Sereboff

(57) ABSTRACT

A semiconductor device is disclosed which has a plurality of unit capacitive elements. At least one lead-out electrode of bottom electrodes of the unit capacitive elements of the capacitive element group is disposed along a circumference going around top electrodes as a whole of the capacitive element group, and a given capacitive element is connectable to the capacitive element group, the given capacitive element having a capacitance value that is set to eliminate effects of parasitic capacitance of at least the capacitive element group. Furthermore, the given capacitive element may consist of a capacitive element group.

18 Claims, 7 Drawing Sheets

(WHEN 2.0V IS DETECTED)

(WHEN 2.9V IS DETECTED)

(WHEN 1.3V IS DETECTED)

(WHEN 1.4V IS DETECTED)

(WHEN 1.5V IS DETECTED)

SEMICONDUCTOR DEVICE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority upon Japanese Patent Application No. 2003-197069 filed on Jul. 15, 2003, which is herein incorporated by reference.

BACKGROUND OF THE INVENTION

1. Field of the Invention

The present invention relates to a semiconductor device.

2. Description of the Related Art

A semiconductor device is known that incorporates a plurality of capacitive elements. Such a semiconductor device is configured, for example, with bipolar integrated circuits. See, for example, Japanese Patent Application Laid-open Publication No. 1999-312784. FIG. 6 shows an example of a cross-sectional structure of a unit capacitive element used in the bipolar integrated circuit. As shown in FIG. 6, a unit capacitive element Cy comprises a P-type semiconductor substrate 1, a P-type isolation region 2, an island region 3 made up of an N-type layer surrounded by the isolation region 2, an N-type bottom electrode region 4 formed on the surface of the island region, an oxide film 5, a dielectric thin film 6 such as silicon nitride film, an aluminum top electrode 7 and a lead-out electrode 8 of a bottom electrode. Its capacitance value is roughly determined by the area of the dielectric thin film 6 in contact with the surface of the bottom electrode 4. This area is equal to the area of an opening portion 5a cleared of the oxide film 5 covering the bottom electrode 4.

As shown in a plan view of FIG. 7, capacitive element groups Ca and Cb are configured through parallel connection of the unit capacitive elements Cy. In the case of a capacitance ratio of 5:15 (1:3), five of the unit capacitive elements Cy are arranged side by side to form the capacitive element Ca. On the other hand, 15 of the unit capacitive elements Cy are arranged side by side to form the capacitive element Cb. The unit capacitive elements Cy of each of the capacitive element groups Ca and Cb are connected to a respective common electrode 12, 13 with connection electrodes 11.

The unit capacitive elements Cy making up each of the capacitive element groups Ca and Cb are connected in parallel each by the electrode wire 11 connected to the top electrode 7. In the case of a three-layer aluminum wiring, the electrode wire is formed by the third wire layer, i.e., the wire layer located at the topmost. The bottom electrode 4 of each of the unit capacitive elements Cy is connected to ground potential GND.

Configuring the above capacitive element groups Ca and Cb presents problems in design and layout pattern of the unit capacitive elements Cy. That is, it is necessary, out of demands for downsizing and higher accuracy of semiconductor devices, to use the smallest possible unit capacitive elements for capacitive element groups for highly accurate capacitance value and capacitance ratio.

In general, however, the smaller the capacitance value of the unit capacitive element Cy for smaller area, the poorer the accuracy of the overall capacitance value and capacitance ratio. For this reason, it is necessary to reduce the area without degrading their accuracy.

However, the conventional design of the unit capacitive element Cy and the aforementioned layout method shown in FIG. 7 have been unfit for high accuracy in capacitance value and ratio and downsizing. That is, if the unit capacitive element Cy is simply reduced in size for downsizing, the capacitance value of the entire capacitive element group falls outside a desired range of values, resulting in larger error. One of the factors contributing to this error is effects of parasitic capacitance of the bottom electrode of each of the unit capacitive elements Cy. The parasitic capacitance includes, for example, parasitic capacitance to ground (electrode-to-ground parasitic capacitance). Among the effects of parasitic capacitance are, for instance, defects including error in circuit characteristics caused by parasitic capacitance, such as error in divided voltage value when the capacitive element group is used in a voltage dividing or other circuit as a constituent element.

SUMMARY OF THE INVENTION

According to a first aspect of the present invention, there is provided a semiconductor device comprising a capacitive element group having a plurality of unit capacitive elements, wherein at least one lead-out electrode of bottom electrodes of the unit capacitive elements of the capacitive element group is disposed along a circumference around top electrodes as a whole of the capacitive element group, and wherein a given capacitive element is connectable to the capacitive element group, the given capacitive element having a capacitance value that is set to eliminate effects of parasitic capacitance of at least the capacitive element group. It is therefore possible to obtain a semiconductor device capable of eliminating effects of parasitic capacitance of the capacitive element group. As a consequence, this allows a semiconductor device with highly accurate capacitance value and ratio to be obtained. Additionally, the capacitive element or the capacitive element group is reduced in size proportionally to the amount of parasitic capacitance eliminated, thus allowing downsizing.

The given capacitive element can have a capacitive element group.

Furthermore, the given capacitive element can have an actual capacitance value set at a value obtained by subtracting the value of the parasitic capacitance from a given capacitance value of the given capacitive element connected to the capacitive element group.

Yet further, it is possible to change the setting of a voltage applied to the capacitive element group, whose parasitic capacitance effects are to be eliminated.

Still further, a voltage applied to one end of the given capacitive element connected to the capacitive element group can be at a fixed given value. Thus, it is possible to eliminate effects of parasitic capacitance of the capacitive element group, whose setting of voltage applied is changed, using the capacitive element to which a fixed, not indefinite, voltage is applied. That is, even if a degree of freedom is imparted to the capacitive element group by making design changes in applied voltage and connected circuit elements, it is possible to eliminate effects of parasitic capacitance with the given capacitive element.

The given capacitive element connected to the capacitive element group can have a capacitance value that is set to eliminate effects of external parasitic capacitance due to external circuitry connected to the capacitive element group. It is therefore possible to obtain a convenient semiconductor device capable of eliminating parasitic capacitance arising from connection with external circuitry.

Yet further, one lead-out electrode can be formed by integrating the at least one lead-out electrode of the unit capacitive elements. It is therefore unnecessary to route the lead-out electrode for each of the unit capacitive elements, allowing downsizing of the semiconductor device through area reduction of the capacitive element group and providing improved patterning accuracy as a result of easier patterning. This in turn leads to improved accuracy in capacitance ratio.

Still further, the unit capacitive elements can be arranged in grid form, and the top electrodes of the unit capacitive elements adjacent to each other can be joined together in the capacitive element group. This therefore eliminates the need to form a wiring pattern for drawing out the top electrode outwards for each of the unit capacitive elements, making it possible to mount the unit capacitive elements at high density and thereby ensuring further reduction of the capacitive element group in area. This leads to further downsizing of the semiconductor device. Arrangement of the unit capacitive elements in grid form provides improved patterning accuracy and therefore improved accuracy in capacitance ratio.

Further, the capacitive element groups can be formed in plurality. Therefore, even if the plurality of capacitive element groups are provided, it is possible to obtain a semiconductor device capable of eliminating effects of parasitic capacitance of the plurality of capacitive element groups. This provides, as a consequence, a semiconductor device with highly accurate capacitance value and ratio. Additionally, the capacitive elements or the capacitive element groups are reduced in size proportionally to the amount of parasitic capacitance eliminated, thus allowing downsizing of the semiconductor device.

DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

<Layout of Unit Capacitive Elements>

Figure 4A:
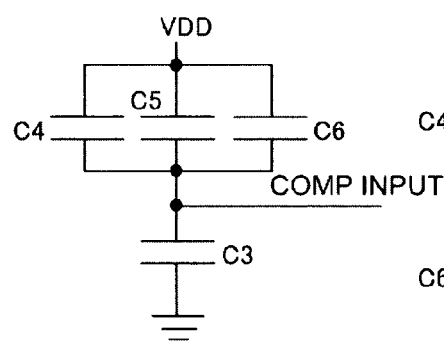
FIGS. 4A to 4C are circuit diagrams showing examples of configuration of a voltage dividing circuit using the semiconductor device of FIG. 2.
Figure 4B:
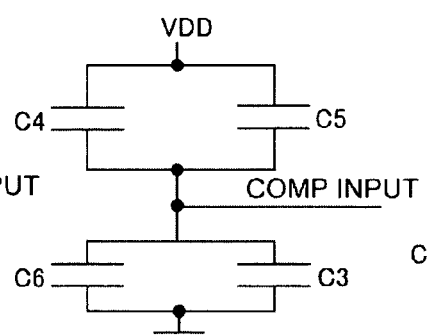
Figure 4C:
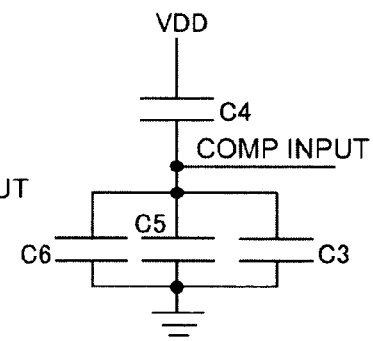
Figure 5:
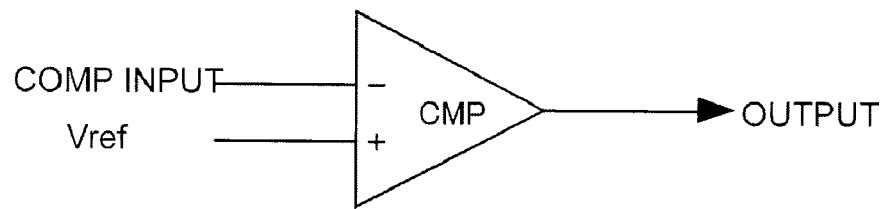
FIG. 5 is a circuit diagram showing a comparator to which the voltage dividing circuits of FIGS. 3A and 3B and FIGS. 4A to 4C are connected.
Figure 6:
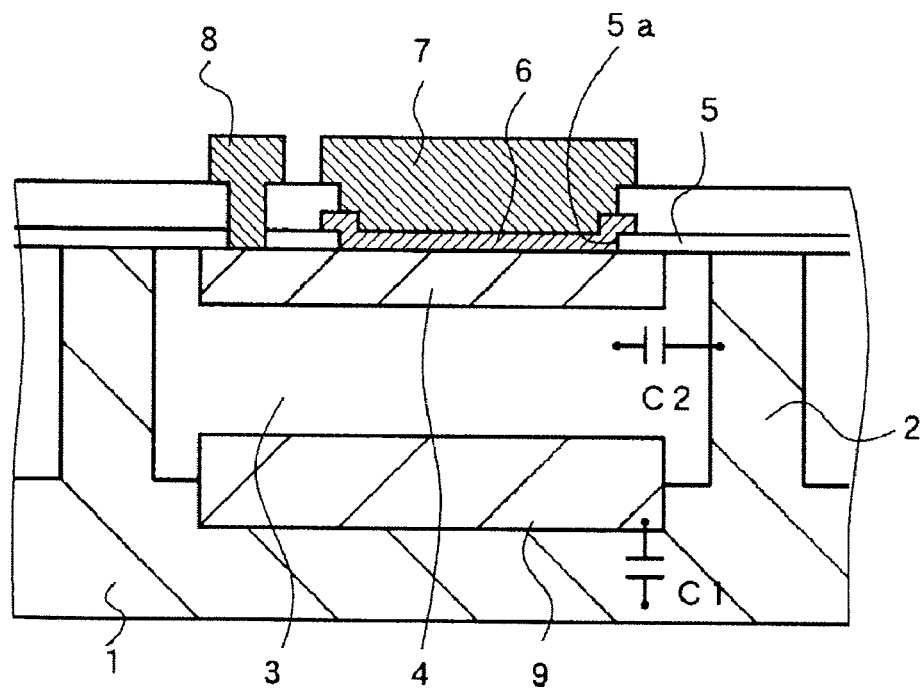
FIG. 6 is a view showing an example of a cross-sectional structure of a unit capacitive element according to the conventional art.

In FIGS. 1 to 9, the same symbols are assigned to components equivalent or identical to conventional components shown in the sectional view of FIG. 6, with their description substituted by the description of the aforementioned related art technology.

Figure 1:
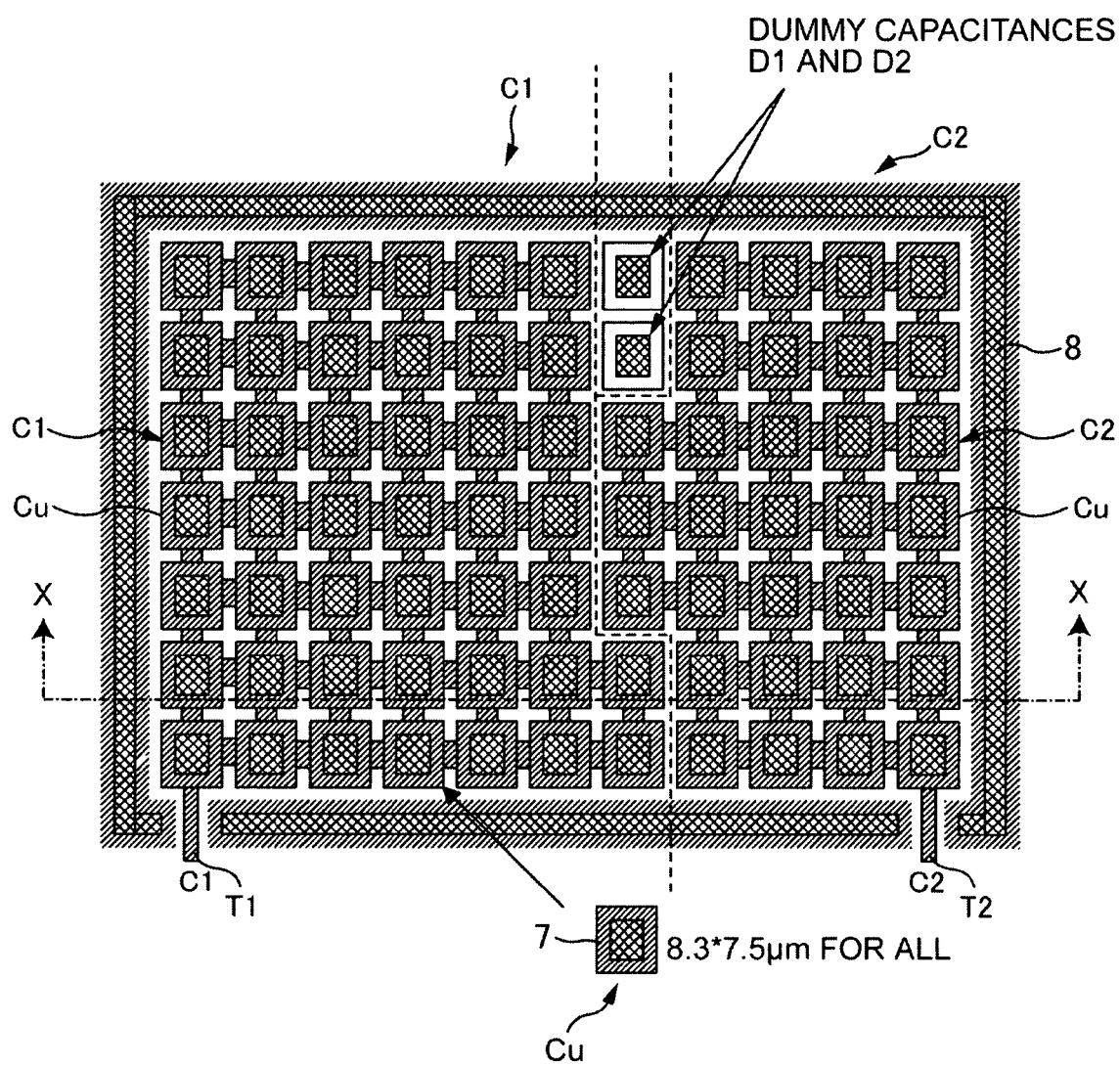
FIG. 1 is a plan view of a semiconductor device according to an embodiment of the present invention.

As shown in the plan view of FIG. 1, the semiconductor device has a pair of capacitive element groups C1 and C2. The left side demarcated by a dashed line is a region of the capacitive element group C1, whereas the right side thereof is a region of the capacitive element group C2. It is to be noted that dummy elements D1 and D2, that will be described later, are provided in a region enclosed by two that the dashed line is split into at the upper portion.

The capacitive element groups C1 and C2 are configured by arranging a number of identical unit capacitive elements Cu. Then, there is disposed the lead-out electrode 8 of the bottom electrodes of the unit capacitive elements Cu of the capacitive element groups C1 and C2 along the circumference around the top electrodes 7 as a whole of all the unit capacitive elements Cu.

Figure 7:
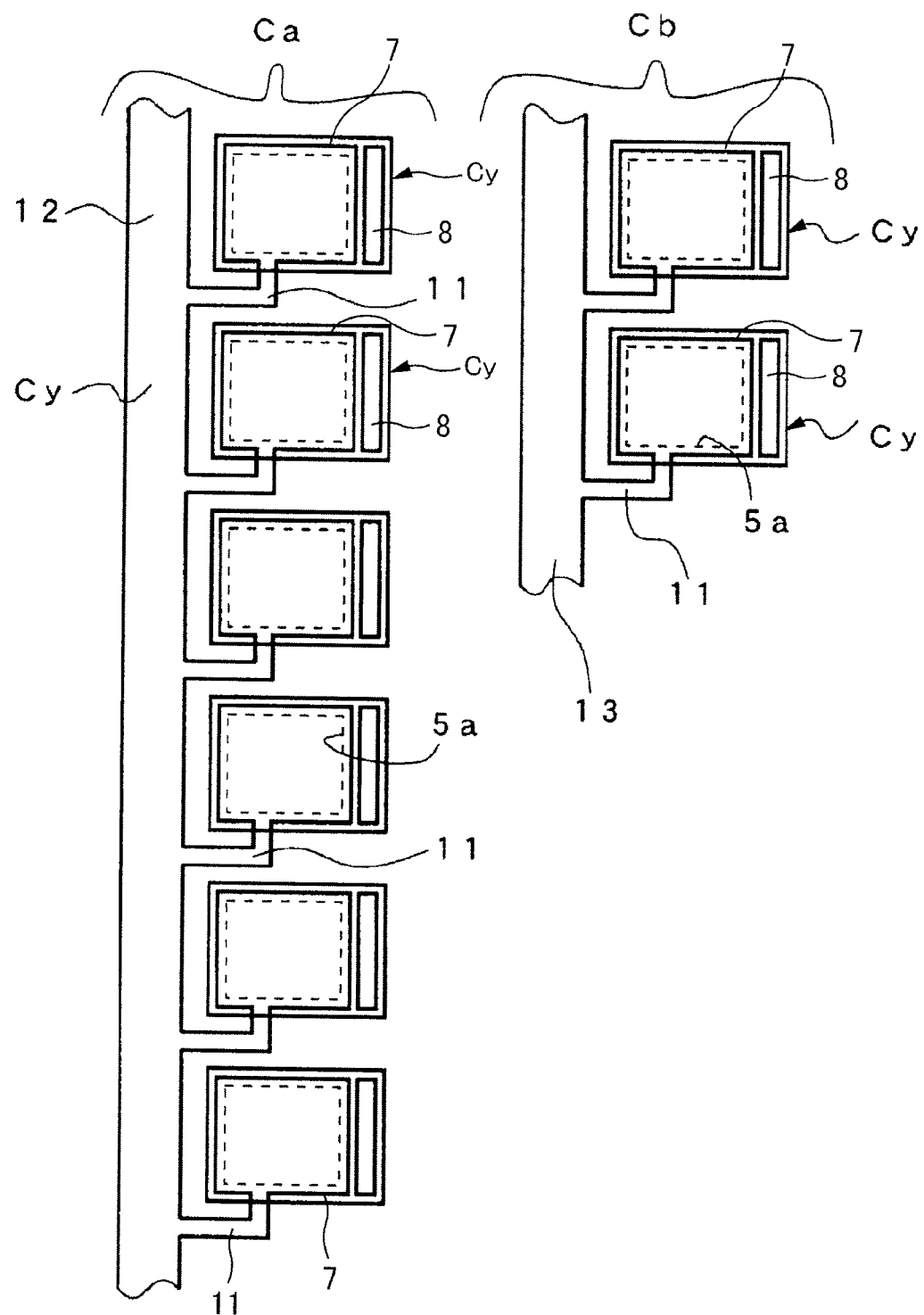
FIG. 7 is a plan view of a layout pattern of the conventional art unit capacitive elements.

Therefore, it is unnecessary, as compared with the aforementioned prior-art layout method shown in FIG. 7, to route the lead-out electrode 8 for each of the unit capacitive elements, allowing downsizing of the semiconductor device through area reduction of the capacitive element group and providing improved patterning accuracy as a result of easier patterning. This in turn ensures improved accuracy of capacitance ratio.

In particular, the lead-out electrode 8 is disposed in the shape of a belt so as to surround the top electrodes 7 as a whole of the capacitive element groups C1 and C2. This eliminates the need to dispose the lead-out electrode 8 for each of the capacitive element groups C1 and C2, allowing further reduction in area of the capacitive element groups C1 and C2. Moreover, the lead-out electrode 8 is disposed so as to surround the top electrodes 7 as a whole, facilitating connection of the lead-out electrode 8 with external and other circuitry.

It is to be noted, however, that, as for the lead-out electrode 8 at areas where it intersects with external connection terminals T1 and T2 of the capacitive element groups C1 and C2, the lead-out electrode 8 is cut to provide space. This allows extraction of the external connection terminals T1 and T2 without these terminals overlapping with the lead-out electrode 8. However, all the bottom electrodes of the unit capacitive elements of the groups C1 and C2 remain connected with each other despite cutting of the lead-out electrode 8 on the surface.

The unit capacitive elements Cu are arranged in grid or array form, with the top electrodes 7 of the unit capacitive elements adjacent to each other joined together in the capacitive element groups C1 and C2. This eliminates the need to form a wiring pattern for drawing out the top electrode 7 outwards for each of the unit capacitive elements Cu, making it possible to mount the unit capacitive elements in large number at high density and thereby ensuring further reduction of the capacitive element groups C1 and C2 in area. This leads to further downsizing of the semiconductor device. Arrangement of the unit capacitive elements in grid form provides improved patterning accuracy as a result of easier patterning, thus ensuring improved accuracy in capacitance ratio.

Further, there are arranged dummy capacitive elements in a vacant region generated between the capacitive element groups C1 and C2 and the lead-out electrode 8. This prevents generation of steps as a result of no elements existing in the vacant region, thus facilitating patterning and providing improved patterning accuracy. This in turn leads to improved accuracy in capacitance ratio.

Figure 9:
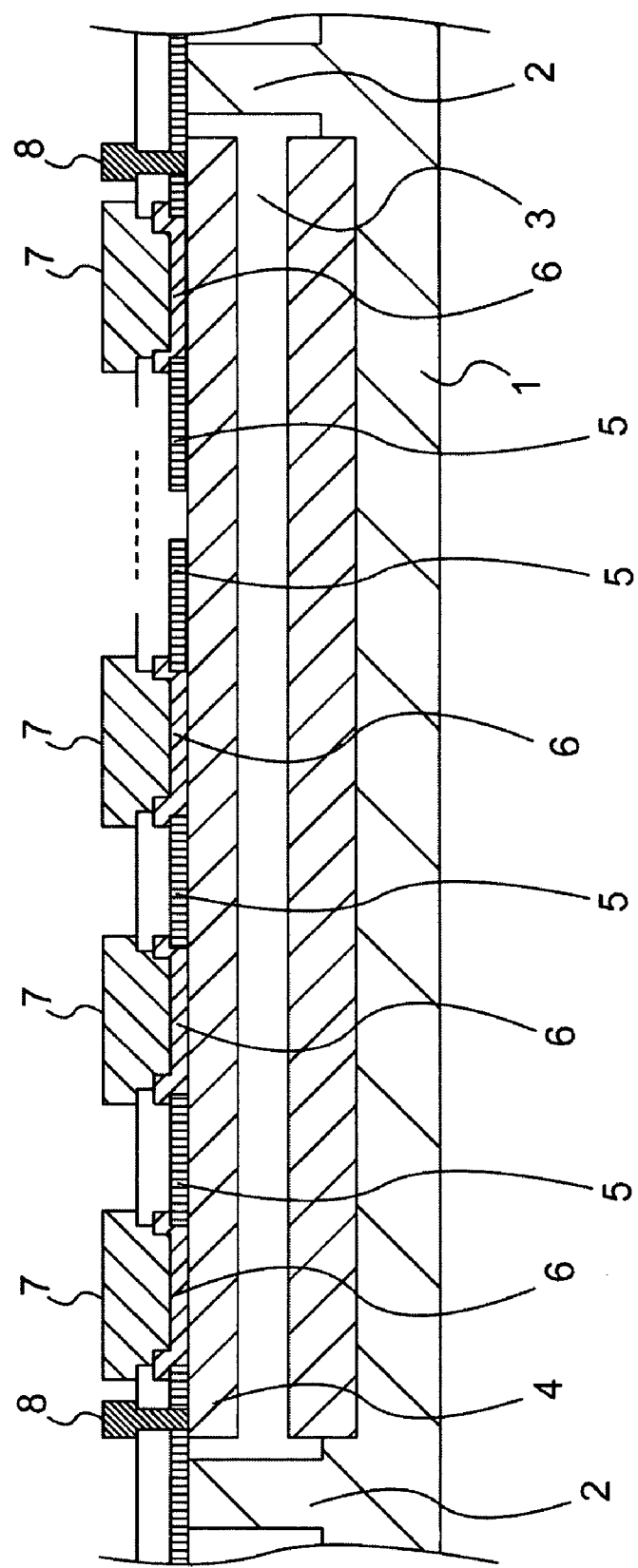
FIG. 9 is a view of the cross-sectional structure of the semiconductor device of FIG. 1.

FIG. 9 is a view of the cross-sectional structure of the semiconductor device of FIG. 1 as seen in the X direction after the semiconductor device is cut along the dot-dashed line straight from the front side of the plane of the Figure to the back side.

A bottom electrode 4 is provided as a continuous electrode under a plurality of the top electrodes 7. The plurality of top electrodes 7 are coupled to the bottom electrode 4 via respective dielectric thin films 6 provided for the top electrodes 7. One lead-out electrode 8 is provided and coupled to the bottom electrode 4 at positions adjacent to the top electrodes 7 located at the ends of the Figure without providing a lead-out electrode 8 for each top electrode 7. By this means, the lead-out electrode 8 can be disposed so as to surround the plurality of top electrodes 7 as a whole.

<Other Embodiments>

Figure 2:
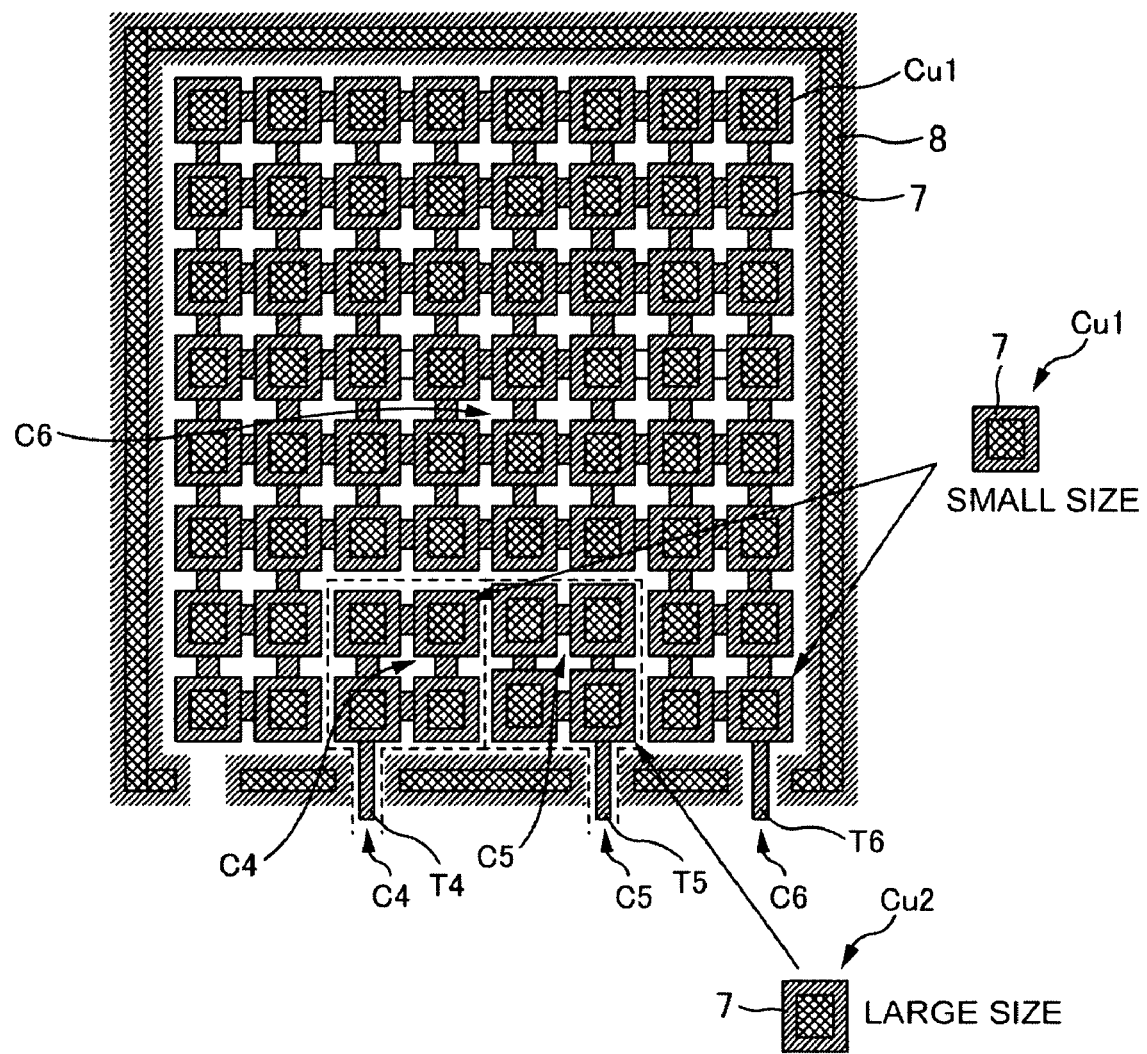
FIG. 2 is a plan view of a semiconductor device according to another embodiment of the present invention.

A layout pattern of a semiconductor device according to another embodiment is shown in a plan view of FIG. 2. The following description will focus on differences since there is commonalities/overlap with the semiconductor device described earlier with reference to FIG. 1 including aspects in relation to capacitance value setting for the unit capacitive elements.

The semiconductor device shown in the plan view of FIG. 2 has three capacitive element groups C4, C5 and C6. Of the two regions enclosed by a dashed line at the bottom, the capacitive element group C4 is arranged on the left side, whereas the capacitive element group C5 is arranged on the right side. There is arranged the capacitive element group C6 in the remaining large region.

The capacitive element group C5 uses unit capacitive elements different in size (capacitance) from those of the capacitive element groups C4 and C6. The capacitive element group C5 is configured by arranging identical unit capacitive elements Cu2 that are relatively larger in size. The capacitive element groups C4 and C6 are each configured by arranging the identical unit capacitive elements Cu1 that are relatively smaller in size.

Then, there is disposed the lead-out electrode 8 of the bottom electrodes of the unit capacitive elements Cu of the capacitive element groups C4, C5 and C6 along the circumference around the top electrodes 7 as a whole of all the unit capacitive elements Cu1 and Cu2 in the capacitive element groups C4, C5 and C6.

<Example of Application to Circuitry for Specific Purpose>

The semiconductor device described with reference to FIG. 1 is used, for example, in voltage dividing circuits capable of ensuring accuracy to 0.1V shown in FIGS. 3A and 3B. The voltage dividing circuit of FIG. 3A detects 2.0V, a set voltage, with a SOLAR terminal, whereas the one of FIG. 3B detects 2.9V, a set voltage, with an EPR terminal. A capacitance C1 used in the voltage dividing circuits is constituted by the capacitive element group C1 in the semiconductor device in FIG. 1. On the other hand, a capacitance C2 is constituted by the capacitive element group C2 in the semiconductor device in FIG. 1.

Figure 3A:
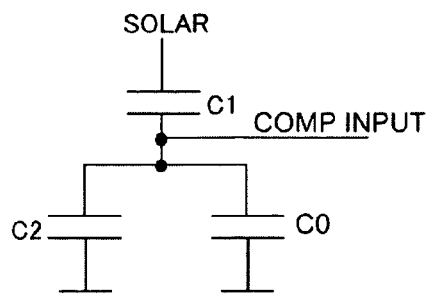
FIGS. 3A and 3B are circuit diagrams showing examples of configuration of a voltage dividing circuit using the semiconductor device of FIG. 1.

The voltage dividing circuit in FIG. 3A has the capacitance C1 connected in series with a parallel circuit of capacitances C0 and C2, each of which is connected to ground at one end. The connection point between the parallel circuit and the capacitance C1, serving as a COMP input terminal, is connected to circuitry at the succeeding stage.

Figure 3B:
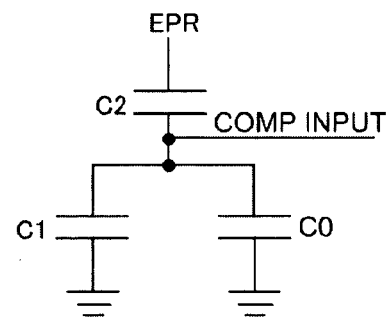

On the other hand, the voltage dividing circuit in FIG. 3B has the capacitance C2 connected in series with a parallel circuit of the capacitances C0 and C1, each of which is connected to ground at one end. The connection point between the parallel circuit and the capacitance C2, serving as the COMP input terminal, is connected to circuitry at the succeeding stage.

A given capacitance ratio of the capacitances C0, C1 and C2 is set for both voltage dividing circuits. As a result, when voltages applied to the input terminals SOLAR and EPR are set voltages of 2.0V and 2.9V as respective references, a voltage with 0.9V as a reference—a common voltage—is obtained from the COMP input terminal, a connection point of the three capacitances. That is, if voltages applied to the input terminals SOLAR and EPR change upward or downward respectively relative to the set voltages 2.0V and 2.9V as the center, the voltage of the COMP input terminal changes upward or downward relative to the common voltage 0.9V as the center.

These voltage dividing circuits may be employed as part of a voltage detection circuit in a measuring instrument such as electronic calipers. That is, a comparator CMP as shown in FIG. 5 may be used as a circuit connected at the succeeding stage to these voltage dividing circuits. That is, the COMP input terminal of each voltage dividing circuit is connected to the inverting input of the comparator CMP. A reference voltage Vref of 0.9V is applied as a comparison reference to the non-inverting input terminal of the comparator CMP. This configuration provides a positive or negative output from the common comparator CMP as voltages applied to the input terminals SOLAR and EPR of the voltage dividing circuits change relative to the respective set voltages 2.0V and 2.9V as the center.

Next, the semiconductor device having the layout pattern as described with reference to FIG. 2 is used, for example, in voltage dividing circuits capable of ensuring accuracy to 0.1V shown in FIGS. 4A to 4C. The voltage dividing circuit of FIG. 4A detects a set voltage of 1.3V with a VDD terminal, and the voltage dividing circuit of FIG. 4B detects a set voltage of 1.4V with the VDD terminal, whereas the voltage dividing circuit of FIG. 4C detects a set voltage of 1.5V with the VDD terminal. A capacitance C4 used in the individual voltage dividing circuits is constituted by the capacitive element group C4 in the semiconductor device of FIG. 2. On the other hand, a capacitance C5 used in the individual voltage dividing circuits is constituted by the capacitive element group C5 in the semiconductor device of FIG. 2. Further, a capacitance C6 used in the individual voltage dividing circuits is constituted by the capacitive element group C6 in the semiconductor device of FIG. 2.

In the voltage dividing circuit in FIG. 4A, a parallel circuit of the capacitances C4, C5 and C6 is connected in series with a capacitance C3 that is grounded at one end. The connection point between the parallel circuit and the capacitance C3 serves as the COMP input terminal and is connected to a circuit at the succeeding stage. It is to be noted that the capacitance C3 may be constituted by a capacitive element group that is made up of a plurality of unit capacitive elements, as with the capacitances C4, C5 and C6.

In the voltage dividing circuit in FIG. 4B, a parallel circuit of the capacitances C4 and C5 is connected in series with a parallel circuit of the capacitances C6 and C3, each of which is grounded at one end. The connection point between the parallel circuits serves as the COMP input terminal and is connected to a circuit at the succeeding stage.

Further, in the voltage dividing circuit in FIG. 4C, the capacitance C4 is connected in series with a parallel circuit of the capacitances C6, C5 and C3, each of which is grounded at one end. The connection point between the parallel circuit and the capacitance C4 serves as the COMP input terminal and is connected to a circuit at the succeeding stage.

For each of the three voltage dividing circuits, a given capacitance ratio of the capacitances C3 to C6 is set. As a result, a voltage with the common voltage of 0.9V as a reference is obtained from the COMP terminal in response to the set voltages of 1.3V, 1.4V and 1.5V as respective references, applied to the input terminals VDD. That is, if voltages applied to the input terminals VDD change upward or downward respectively relative to the set voltages of 1.3V, 1.4V and 1.5V as the center, the voltage of the COMP input terminal changes upward or downward relative to the common voltage 0.9V as the center.

These voltage dividing circuits may be employed as part of a voltage detection circuit in a measuring instrument such as electronic calipers. That is, the comparator CMP as shown in FIG. 5 may be used as a circuit connected at the succeeding stage to these voltage dividing circuits. That is, the COMP input terminal of each of the voltage dividing circuit is connected to the inverting input of the comparator CMP. The reference voltage Vref of 0.9V is applied as a comparison reference to the non-inverting input terminal of the comparator CMP. This configuration provides a positive or negative output from the common comparator CMP as voltages applied to the input terminals VDD of the voltage dividing circuits change relative to the respective set voltages of 1.3V, 1.4V and 1.5V as the center.

<Elimination of Parasitic Capacitance of Capacitive Element Groups>

A description will be given of the technique for eliminating effects of parasitic capacitance of the capacitive element groups C1 and C2 and C4 to C6 with reference to FIGS. 1 to 4A to 4C.

Elimination of parasitic capacitance will be described first in the semiconductor device in FIG. 1 provided with the capacitive element groups C1 and C2. As shown in the voltage dividing circuits in FIGS. 3A and 3B and as described earlier, the capacitance C0 (given capacitive element) with one end grounded is connected to the capacitive element groups C1 and C2 forming part of a semiconductor device. There are at least two ways in which the capacitive element groups C1 and C2 are connected and a voltage is applied, for example, as shown in FIGS. 3A and 3B, with voltage settings being changeable. That is, in the case of the voltage dividing circuit in FIG. 3A, a set voltage of 2.0V is applied to the SOLAR terminal of the capacitive element group C1, with the other end of the capacitive element group C1 connected to the capacitive element group C2. As for the voltage dividing circuit in FIG. 3B, on the other hand, the capacitive element group C1 is grounded at one end and connected to the capacitive element group C2 at the other end. The capacitive element group C2 is grounded at one end and connected to the capacitive element group C1 at the other end in the voltage dividing circuit in FIG. 3A. In the voltage dividing circuit in FIG. 3B, on the other hand, the capacitive element group C2 has a set voltage of 2.9V applied to its EPR terminal, with its other end connected to the capacitive element group C1.

In contrast to the capacitive element groups C1 and C2, the capacitance C0 is grounded at one end in both voltage dividing circuits as shown in FIGS. 3A and 3B. That is, the voltage applied to one end of the capacitance C0 is at a fixed given value (ground potential).

Effects of parasitic capacitance in the capacitive element groups C1 and C2 are eliminated by using the setting of the capacitance C0. This provides a semiconductor device with highly accurate capacitance value and ratio. The capacitive element (or capacitive element group) C0 is reduced in size proportionally to the amount of parasitic capacitance eliminated, thus allowing downsizing. In particular, it is possible to eliminate effects of parasitic capacitance of the capacitive element groups C1 and C2, whose setting of voltage applied is changed, using the capacitance C0, to which a fixed voltage (ground potential) is applied at one end, that is connected to the semiconductor device configured with the capacitive element groups C1 and C2. That is, it is possible to eliminate effects of parasitic capacitance using the fixed capacitance C0, despite a degree of freedom imparted by making design changes including voltage applied and circuit elements connected to the capacitive element groups C1 and C2.

A description will be made about how this capacitance value is specifically set. First, the principle of the setting will be described. The calculated value of parasitic capacitance is subtracted from the theoretical setting of the capacitance C0 (given capacitance value; a value not taking into consideration effects of parasitic capacitance) to be connected to the capacitive element groups C1 and C2. The value obtained as a result of subtraction is used as the actual capacitance value of the capacitance C0.

More specifically, the total parasitic capacitance value of the bottom electrodes 4 is calculated for the capacitive element groups C1 and C2 in the semiconductor device having the layout pattern shown in FIG. 1. For a semiconductor device whose layout pattern is decided upon, it is possible to calculate the total parasitic capacitance value of the bottom electrodes 4 by multiplying the parasitic capacitance value per unit area by the entire area of the bottom electrodes 4. The total parasitic capacitance value of the bottom electrodes 4 is subtracted from the theoretical setting of the capacitance C0, and the value obtained as a result of subtraction is used as the actual capacitance value of the capacitance C0.

It is also possible to eliminate effects of parasitic capacitance of external circuitry connected to the capacitive element groups C1 and C2 making up the semiconductor device when the actual capacitance value of the capacitance C0 is set. That is, a subtraction is also made of the parasitic capacitance of transistors making up the comparator (external circuit; this circuitry may include an electronic device/element/component) in FIG. 5 connected to the voltage dividing circuits shown in FIGS. 3A and 3B from the theoretical setting of the capacitance C0 as described above. This provides a convenient semiconductor device capable of eliminating parasitic capacitance when connected to external circuitry.

It is to be noted that effects of parasitic capacitance are eliminated by equalizing the lengths of wires from the comparator to the capacitive element groups C1 and C2 in order to eliminate effects of external parasitic capacitance.

The capacitive element groups C1 and C2 are configured to be trimmable to allow adjustment of the capacitance values.

The configuration, in which the capacitance C0 and the capacitive element groups C1 and C2 are integrated into a single semiconductor device, is included in the technical concept of the present invention. Further, the technical concept of the present invention includes the design for eliminating effects of parasitic capacitance of the entire semiconductor device including parasitic capacitance of the capacitance C0 itself or external parasitic capacitance.

Next, a description will be given of elimination of parasitic capacitance of the semiconductor device in FIG. 2 provided with the capacitive element groups C4 to C6. As shown in FIGS. 4A to 4C and as described above, the capacitance C3 (given capacitive element) with one end grounded is connected to the capacitive element groups C4 to C6 making up the semiconductor device. There are at least three ways in which the capacitive element groups C4 to C6 are connected and a voltage is applied, for example, as described with reference to FIGS. 4A to 4C, with voltage settings being changeable.

In contrast to the capacitive element groups C4 to C6, the capacitance C3 is grounded at one end in all the voltage dividing circuits as shown in FIGS. 4A to 4C. That is, the voltage applied to one end of the capacitance C3 is at a fixed given value (ground potential).

Effects of parasitic capacitance of the capacitive element groups C4 to C6 are eliminated by using the setting of the capacitance C3. This provides a semiconductor device with highly accurate capacitance value and ratio. The capacitive element (or capacitive element group) C3 is reduced in size proportionally to the amount of parasitic capacitance eliminated, thus allowing downsizing. In particular, it is possible to eliminate effects of parasitic capacitance of the capacitive element groups C4 to C6, whose setting of voltage applied is changed, using the capacitance C3, to which a fixed voltage (ground potential) is applied at one end, that is connected to the semiconductor device configured with the capacitive element groups C4 to C6. That is, it is possible to eliminate effects of parasitic capacitance using the fixed capacitance C3, despite a degree of freedom imparted by making design changes including voltage applied and circuit elements connected to the capacitive element groups C4 to C6.

The principle of the capacitance value setting is the same as with the capacitive element groups C1 and C2 described with reference to FIG. 1 and FIGS. 3A and 3B. That is, the calculated value of parasitic capacitance is subtracted from the theoretical setting of the capacitance C3 (given capacitance value; a value not taking into consideration effects of parasitic capacitance) to be connected to the capacitive element groups C4 to C6. The value obtained as a result of subtraction is used as the actual capacitance value of the capacitance C3. The specific setting method for the actual capacitance value, including elimination of effects of external parasitic capacitance, is the same as with the capacitive element groups C1 and C2 described with reference to FIG. 1 and FIGS. 3A and 3B. It is to be noted that the capacitive element groups C4 to C6 are also configured to be trimmable to allow adjustment of the capacitance values.

The configuration, in which the capacitance C3 and the capacitive element groups C4 to C6 are integrated into a single semiconductor device, is included in the technical concept of the present invention. Further, the technical concept of the present invention includes the design for eliminating effects of parasitic capacitance of the entire semiconductor device including parasitic capacitance of the capacitance C3 itself or external parasitic capacitance.

Figure 8:
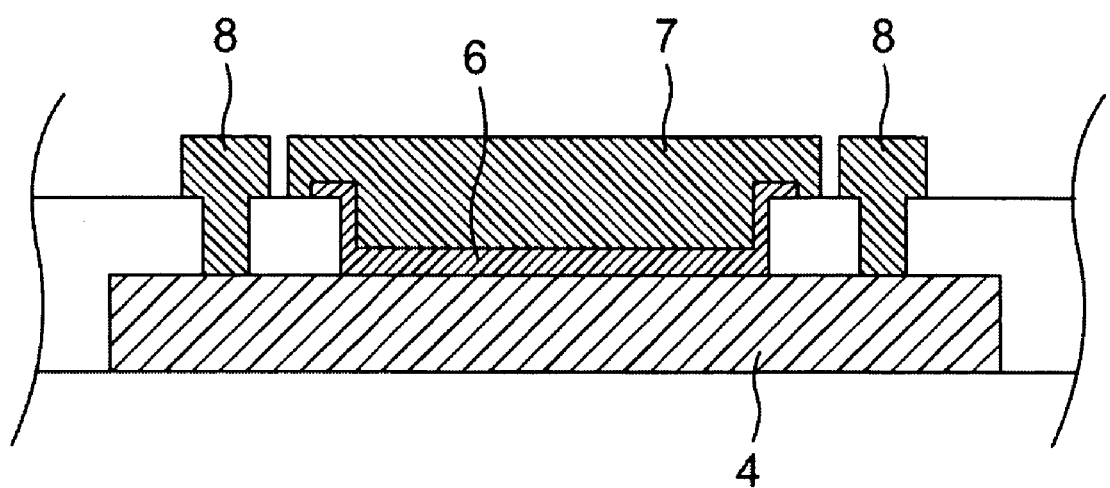
FIG. 8 is a view showing an example of a cross-sectional structure of a unit capacitive element according to an embodiment of the present invention.

While a cross-sectional structure shown in FIG. 6 is taken as an example of the cross-sectional structure of the unit capacitive element, various forms of cross-sectional structures may be applied to the present invention. The cross-sectional structure shown in FIG. 8 is also preferred as an embodiment of the present invention. That is, the lead-out electrode 8 of the bottom electrode is arranged adjacent to the circumference of the top electrode 7 in a cross-sectional structure of a unit capacitive element as shown in FIG. 8.

It is possible to obtain a semiconductor device capable of eliminating effects of parasitic capacitance of the capacitive element groups. This provides, as a consequence, a semiconductor device with highly accurate capacitance value and ratio. Additionally, the capacitive elements or the capacitive element groups are reduced in size proportionally to the amount of parasitic capacitance eliminated, thus allowing downsizing of the semiconductor device.

While illustrative and presently preferred embodiments of the present invention have been described in detail herein, it is to be understood that the inventive concepts may be otherwise variously embodied and employed and that the appended claims are intended to be construed to include such variations except insofar as limited by the conventional art.

It is claimed:

1. A semiconductor device comprising a capacitive element group having a plurality of unit capacitive elements, wherein at least one lead-out electrode for bottom electrodes of the unit capacitive elements of the capacitive element group is disposed along a circumference around top electrodes as a whole of the capacitive element group, and wherein a given capacitive element is connectable to the capacitive element group, the given capacitive element having a capacitance value that is set to eliminate effects of parasitic capacitance of at least the capacitive element group.

2. The semiconductor device according to claim 1, wherein the given capacitive element has a capacitive element group.

3. The semiconductor device according to claim 1, wherein the setting of a voltage applied to the capacitive element group, whose parasitic capacitance effects are to be eliminated is changed.

4. The semiconductor device according to claim 3, wherein a voltage applied to one end of the given capacitive element connected to the capacitive element group is at a fixed given value.

5. The semiconductor device according to claim 1, wherein the given capacitive element connected to the capacitive element group has a capacitance value that is set to eliminate effects of external parasitic capacitance due to external circuitry connected to the capacitive element group.

6. The semiconductor device according to claim 1, wherein one lead-out electrode is formed by integrating the at least one lead-out electrode of the unit capacitive elements.

7. The semiconductor device according to claim 1, wherein a plurality of the capacitive element groups are formed in the semiconductor device.

8. The semiconductor device according to claim 1, which is used for a voltage dividing circuit comprising, as a constituent element, the capacitive element group.

9. A semiconductor device comprising a capacitive element group having a plurality of unit capacitive elements
   wherein at least one lead-out electrode for bottom electrodes of the unit capacitive elements of the capacitive element group is disposed along a circumference around top electrodes as a whole of the capacitive element group
   wherein a given capacitive element is connectable to the capacitive element group, the given capacitive element having a capacitance value that is set to eliminate effects of parasitic capacitance of at least the capacitive element group
   wherein the given capacitive element has an actual capacitance value set at a value obtained by subtracting a value of the parasitic capacitance from a given capacitance value of the given capacitive element connected to the capacitive element group.

10. The semiconductor device according to claim 9 wherein the setting of a voltage applied to the capacitive element group, whose parasitic capacitance effects are to be eliminated is changed.

11. The semiconductor device according to claim 10 wherein a voltage applied to one end of the given capacitive element connected to the capacitive element group is at a fixed given value.

12. The semiconductor device according to claim 9 wherein the given capacitive element connected to the capacitive element group has a capacitance value that is set to eliminate effects of external parasitic capacitance due to external circuitry connected to the capacitive element group.

13. The semiconductor device according to claim 9 wherein one lead-out electrode is formed by integrating the at least one lead-out electrode of the unit capacitive elements.

14. The semiconductor device according to claim 9
   wherein the unit capacitive elements are arranged in grid form
   wherein the top electrodes of the unit capacitive elements adjacent to each other are joined together in the capacitive element group.

15. The semiconductor device according to claim 9
   wherein a plurality of the capacitive element groups are formed in the semiconductor device.

16. The semiconductor device according to claim 9 which is used for a voltage dividing circuit comprising, as a constituent element, the capacitive element group.

17. A semiconductor device comprising
   a plurality of identical unit capacitive elements having respective first electrodes and second electrodes, wherein the unit capacitive elements are arranged in an grid
   at least one lead-out electrode connected to the first electrodes and disposed around the second electrodes as a whole
   a first grouping of the unit capacitive elements having a first external connection terminal, wherein the second electrodes of the unit capacitive elements of the first group which are adjacent to each other are joined
   a second grouping of the unit capacitive elements distinct from the first group and having a second external connection terminal, wherein the second electrodes of the unit capacitive elements of the second group which are adjacent to each other are joined.

18. The semiconductor device according to claim 17 wherein at least one of the unit capacitive elements comprises a dummy and is apart from the first grouping and the second grouping.

* * * * *